United States Patent
Inada et al.

(10) Patent No.: US 9,224,624 B2
(45) Date of Patent: Dec. 29, 2015

(54) LIQUID PROCESSING METHOD

(71) Applicant: Tokyo Electron Limited, Tokyo (JP)

(72) Inventors: Takao Inada, Hsin-chu (TW); Naoyuki Okamura, Koshi (JP); Hidetsugu Yano, Koshi (JP); Yosuke Hachiya, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/580,787

(22) Filed: Dec. 23, 2014

(65) Prior Publication Data

US 2015/0107631 A1    Apr. 23, 2015

Related U.S. Application Data

(62) Division of application No. 13/106,972, filed on May 13, 2011, now Pat. No. 8,951,359.

(30) Foreign Application Priority Data

May 17, 2010 (JP) ................ 2010-113186
Mar. 24, 2011 (JP) ................ 2011-065807

(51) Int. Cl.
*B08B 7/00* (2006.01)
*B08B 3/00* (2006.01)
*B08B 7/04* (2006.01)
*H01L 21/67* (2006.01)

(52) U.S. Cl.
CPC .... *H01L 21/67028* (2013.01); *H01L 21/67017* (2013.01); *H01L 21/67051* (2013.01); *Y10S 134/902* (2013.01)

(58) Field of Classification Search
CPC ............... H01L 21/67051; H01L 21/67017; H01L 21/67028; Y10S 134/902
See application file for complete search history.

(56) References Cited

U.S. PATENT DOCUMENTS

| 6,299,697 B1 | 10/2001 | Nishibe |
| 6,559,064 B1 | 5/2003 | Shimizu |
| 6,589,338 B1 | 7/2003 | Nakamori |
| 2002/0029788 A1 | 3/2002 | Verhaverbeke |
| 2006/0237043 A1 | 10/2006 | Verhaverbeke |
| 2006/0266389 A1 | 11/2006 | Thakur |
| 2007/0123052 A1 | 5/2007 | Kashkoush |

(Continued)

FOREIGN PATENT DOCUMENTS

| JP | 2005-032819 A | 2/2005 |
| JP | 2006-278509 A | 10/2006 |

(Continued)

*Primary Examiner* — Alexander Markoff
(74) *Attorney, Agent, or Firm* — Pearne & Gordon LLP

(57) ABSTRACT

A liquid processing method is provided for performing a liquid process on a front surface of a substrate by using a processing solution and then performing a rinse process on the front surface of the substrate by using a rinse solution having a temperature lower than a temperature of the processing solution. The method includes performing an intermediate process between the liquid process and the rinse process, for adjusting a temperature of the front surface of the substrate to a temperature higher than the temperature of the rinse solution and lower than the temperature of the processing solution. In the intermediate process, an intermediate processing solution having a temperature higher than the temperature of the rinse solution and lower than the temperature of the processing solution is supplied only to a rear surface of the substrate.

4 Claims, 11 Drawing Sheets

(56) References Cited

U.S. PATENT DOCUMENTS

| | | |
|---|---|---|
| 2007/0186960 A1 | 8/2007 | Danbata |
| 2008/0041427 A1 | 2/2008 | Brown |
| 2011/0143550 A1 | 6/2011 | Saito |

FOREIGN PATENT DOCUMENTS

| | | |
|---|---|---|
| JP | 2007-059816 A | 3/2007 |
| JP | 2007-227764 A | 9/2007 |
| JP | 2009-239026 A | 10/2009 |
| JP | 2009-267167 A | 11/2009 |
| KR | 10-2007-0024378 A | 3/2007 |

LIQUID PROCESSING METHOD

CROSS-REFERENCE TO RELATED APPLICATION

This is a divisional application of U.S. patent application Ser. No. 13/106,972, filed on May 13, 2011 which claims the benefit of Japanese Patent Application Nos. 2010-113186 and 2011-065807 filed on May 17, 2010 and Mar. 24, 2011, respectively, the entire disclosures of which are incorporated herein by reference.

FIELD OF THE INVENTION

The present disclosure relates to a liquid processing method. More particularly, the present disclosure relates to a liquid processing method for processing a surface of a substrate with a processing solution and then for rinsing the surface of the substrate with a rinse solution.

BACKGROUND OF THE INVENTION

Conventionally, in a process of manufacturing a semiconductor component, a flat display, or the like, a liquid processing apparatus has been used to process a substrate such as a semiconductor wafer or a liquid crystal substrate with a processing solution such as a cleaning solution or an etching solution and then to rinse the substrate with a rinse solution.

The liquid processing apparatus includes a substrate processing chamber installed within a housing, and in the substrate processing chamber, there are provided a substrate holding unit for holding and rotating a substrate horizontally, a processing solution supply unit for supplying a processing solution to the substrate so as to perform a liquid process of the substrate, and a rinse solution supply unit for supplying a rinse solution to the substrate so as to perform a rinse process of the substrate.

In such a liquid processing apparatus, liquid process of the substrate is performed by supplying the processing solution from the processing solution supply unit toward a surface (a main surface on which a circuit is to be formed) of the substrate horizontally rotated and held by the substrate holding unit, and rinsing of the substrate is subsequently performed by supplying the rinse solution from the rinse solution supply unit toward the surface of the substrate horizontally rotated and held by the substrate holding unit.

By way of example, as described in Patent Document 1, in this liquid processing apparatus, a liquid process for removing a resist from a surface of a substrate is performed by using SPM (Sulfuric acid/hydrogen Peroxide Mixture) having a temperature equal to or higher than about 100° C. as a processing solution. The SPM is prepared by mixing sulfuric acid and hydrogen peroxide and allowing them to make a chemical reaction generating reaction heat. After the completion of the liquid process, a rinse process is performed by using pure water of a room temperature as a rinse solution.
Patent Document 1: Japanese Patent Laid-open Publication No. 2006-278509

In the conventional liquid processing apparatus, however, since the rinse process is performed by using the rinse solution of which a temperature is lower than a temperature of the processing solution immediately after the liquid process using the high-temperature processing solution is finished, the substrate may be thermally deformed and bent due to a great difference in substrate temperatures between the liquid process and the rinse process. Accordingly, the substrate may not be firmly held by the substrate holding unit. Besides, the processing solution may be dispersed from the surface of the substrate to the vicinity thereof, resulting in contamination or damage of the inside of the substrate processing chamber.

Moreover, in the aforementioned liquid processing apparatus, immediately after the rinse solution is begun, the rinse solution may be supplied to the substrate of which temperature is still high after the liquid process. Thus, depending on the kind of the processing solution or the rinse solution, the remaining processing solution and the supplied rinse solution may make a rapid chemical reaction under a high-temperature atmosphere, and reaction products may be dispersed in the form of mists, resulting in contamination or damage of the inside of the substrate processing chamber.

BRIEF SUMMARY OF THE INVENTION

In view of the foregoing, in accordance with one aspect of the present disclosure, there is provided a liquid processing apparatus that performs a liquid process on a front surface of a substrate by using a processing solution and then performs a rinse process on the front surface of the substrate by using a rinse solution. The liquid processing apparatus includes a substrate holding unit capable of holding the substrate; a processing solution supply unit capable of supplying the processing solution to the front surface of the substrate so as to perform the liquid process on the substrate; a rinse solution supply unit capable of supplying the rinse solution having a temperature lower than a temperature of the processing solution to the front surface of the substrate so as to perform the rinse process on the substrate; and a control unit capable of adjusting a temperature of the front surface of the substrate to a temperature higher than the temperature of the rinse solution and lower than the temperature of the processing solution between the liquid process and the rinse process performed on the front surface of the substrate.

Further, the control unit may be configured to supply, to the substrate, an intermediate processing solution having a temperature higher than the temperature of the rinse solution and lower than the temperature of the processing solution between the liquid process and the rinse process performed on the front surface of the substrate.

Furthermore, the control unit may be configured to supply, only to a rear surface of the substrate, an intermediate processing solution having a temperature higher than the temperature of the rinse solution and lower than the temperature of the processing solution between the liquid process and the rinse process performed on the front surface of the substrate.

Further, the processing solution supply unit may be configured to supply a mixed solution as the processing solution to the substrate, the mixed solution including a first liquid chemical and a heated second liquid chemical which make a chemical reaction generating reaction heat. Furthermore, the control unit may be configured to control the processing solution supply unit to stop the supply of the first liquid chemical and supply the second liquid chemical, so as to adjust the temperature of the front surface of the substrate to a temperature higher than the temperature of the rinse solution and lower than the temperature of the processing solution between the liquid process and the rinse process performed on the front surface of the substrate.

Further, between the liquid process and the rinse process performed on the front surface of the substrate, the control unit may be configured to control the substrate holding unit to rotate the substrate in a state that a supply of the processing solution from the processing solution supply and a supply of the rinse solution from the rinse solution supply unit to the front surface of the substrate unit may be stopped.

Further, the processing solution supply unit may be configured to supply a mixed solution as the processing solution to the substrate and the mixed solution includes a first liquid chemical and a heated second liquid chemical which make a chemical reaction generating reaction heat. Furthermore, the rinse solution supply unit may be configured to supply the rinse solution to the front surface of the substrate and supply a heated rinse solution to the rear surface of the substrate. Further, between the liquid process and the rinse process performed on the front surface of the substrate, the control unit may be configured to control the processing solution supply unit to stop the supply of the first liquid chemical and supply the second liquid chemical so as to adjust the temperature of the front surface of the substrate to the temperature higher than the temperature of the rinse solution and lower than the temperature of the processing solution. Furthermore, the control unit may be configured to control the rinse solution supply unit to supply, to the rear surface of the substrate, a rinse solution heated to a temperature higher than the temperature of the rinse solution to be supplied to the front surface of the substrate and lower than a temperature of the second liquid chemical.

Further, the first liquid chemical may include oxygenated water; the second liquid chemical may include sulfuric acid; and the rinse solution may include pure water.

In accordance with another aspect of the present disclosure, there is provided a liquid processing apparatus including a substrate holding unit capable of holding a substrate; a processing solution supply pipe capable of supplying a processing solution to a front surface of the substrate; a first liquid chemical supply pipe capable of supplying a first liquid chemical into the processing solution supply pipe via a first opening/closing valve; a second liquid chemical supply pipe capable of supplying a second liquid chemical into the processing solution supply pipe via a second opening/closing valve; a rinse supply pipe capable of supplying a rinse solution having a temperature lower than a temperature of the processing solution to the front surface of the substrate via a rinse solution opening/closing valve; and a control unit capable of controlling the first opening/closing valve, the second opening/closing valve and the rinse solution opening/closing valve. Here, the control unit may be configured to supply a mixture of the first liquid chemical and the second liquid chemical as the processing solution by opening the first and second opening/closing valves; supply the second liquid chemical for adjusting the temperature of the front surface of the substrate to a temperature higher than the temperature of the rinse solution and lower than the temperature of the processing solution by closing the first opening/closing valve and opening the second opening/closing valve; and supply the rinse solution having a temperature lower than the temperature of the processing solution to the substrate by closing the first and second opening/closing valves and opening the rinse solution opening/closing valve.

In accordance with still another aspect of the present disclosure, there is provided a liquid processing method for performing a liquid process on a front surface of a substrate by using a processing solution and then performing a rinse process on the front surface of the substrate by using a rinse solution having a temperature lower than a temperature of the processing solution. The liquid processing method includes performing an intermediate process between the liquid process and the rinse process, for adjusting a temperature of the front surface of the substrate to a temperature higher than the temperature of the rinse solution and lower than the temperature of the processing solution.

Further, in the intermediate process, an intermediate processing solution having a temperature higher than the temperature of the rinse solution and lower than the temperature of the processing solution may be supplied to the substrate.

Furthermore, in the intermediate process, an intermediate processing solution having a temperature higher than the temperature of the rinse solution and lower than the temperature of the processing solution may be supplied only to a rear surface of the substrate.

Further, in the intermediate process, the substrate may be rotated in a state that a supply of the processing solution and a supply of the rinse solution are stopped.

Furthermore, in the liquid process, a mixed solution as the processing solution may be supplied to the substrate and the mixed solution may include a first liquid chemical and a heated second liquid chemical which make a chemical reaction generating reaction heat. Furthermore, in the intermediate process, the supply of the first liquid chemical may be stopped and the second liquid chemical may be supplied between the liquid process and the rinse process performed on the front surface of the substrate so as to adjust the temperature of the front surface of the substrate to the temperature higher than the temperature of the rinse solution and lower than the temperature of the processing solution.

Further, in the intermediate process, between the liquid process and the rinse process performed on the front surface of the substrate, a first intermediate processing solution having a temperature higher than the temperature of the rinse solution and lower than the temperature of the processing solution may be supplied to the front surface of the substrate and, then, a second intermediate processing solution having a temperature higher than the temperature of the rinse solution and lower than the temperature of the first intermediate processing solution may be supplied to the rear surface of the substrate.

Further, in the intermediate process, between the liquid process and the rinse process performed on the front surface of the substrate, a first intermediate processing solution having a temperature higher than the temperature of the rinse solution and lower than the temperature of the processing solution may be supplied to the front surface of the substrate and, then, a second intermediate processing solution having a temperature higher than the temperature of the rinse solution and lower than the temperature of the first intermediate processing solution may be supplied to the rear surface of the substrate. Further, in the rinse process, a rinse solution having a temperature substantially equal to the temperature of the second intermediate processing solution may be supplied to the front surface of the substrate and, then, a rinse solution having a temperature lower than the temperature of the second intermediate processing solution may be supplied to the front surface of the substrate.

Furthermore, the processing solution may include a mixed solution of fluoric acid and oxygenated water; the first intermediate processing solution may include heated sulfuric acid; the second intermediate processing solution may include pure water; and the rinse solution may include pure water.

In accordance with still another aspect of the present disclosure, there is provided a computer-readable storage medium having stored thereon computer-executable instructions that, in response to execution, cause a liquid processing apparatus to perform operations. The operations include performing a liquid process on a front surface of a substrate by using a processing solution; performing a rinse process on the front surface of the substrate by using a rinse solution having a temperature lower than a temperature of the processing solution; and between the liquid process and the rinse process, performing an intermediate process for adjusting a temperature of the front surface of the substrate to a temperature higher than the temperature of the rinse solution and lower than the temperature of the processing solution.

Further, in the intermediate process, an intermediate processing solution having a temperature higher than the temperature of the rinse solution and lower than the temperature of the processing solution may be supplied to the substrate.

Furthermore, in the intermediate process, an intermediate processing solution having a temperature higher than the temperature of the rinse solution and lower than the temperature of the processing solution may be supplied only to a rear surface of the substrate.

Further, in the intermediate process, the substrate may be rotated in a state that a supply of the processing solution and a supply of the rinse solution may be stopped.

Furthermore, in the intermediate process, a first intermediate processing solution having a temperature higher than the temperature of the rinse solution and lower than the temperature of the processing solution may be supplied to the front surface of the substrate and, then, a second intermediate processing solution having a temperature higher than the temperature of the rinse solution and lower than the temperature of the first intermediate processing solution may be supplied to the rear surface of the substrate.

In accordance with the present disclosure, since an intermediate process is performed between a liquid process and a rinse process so as to adjust a temperature of a front surface of a substrate to be higher than a temperature of a rinse solution and lower than a temperature of a processing solution, a temperature variation of the substrate is reduced, and, thus, a thermal deformation of the substrate can be prevented. Accordingly, the substrate can be firmly held by a substrate holding unit, and dispersion of the processing solution due to the deformation of the substrate can be avoided. Thus, contamination or damage of the inside of a substrate processing chamber can be suppressed.

Furthermore, in accordance with the present disclosure, since the temperature of the substrate immediately after the beginning of the rinse process can be decreased as compared to a conventional case, a chemical reaction between the processing solution and the rinse solution can be suppressed even when the processing solution and the rinse solution chemically act on each other depending on the kind of the processing solution or the rinse solution. Accordingly, dispersion of reaction products generated by the chemical reaction can be prevented, so that contamination or damage of the inside of the substrate processing chamber can be suppressed.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, a detailed configuration of a liquid processing apparatus, a liquid processing method and a liquid processing program in accordance with an illustrative embodiment of the present disclosure will be described with reference to the accompanying drawings.

Figure 1:
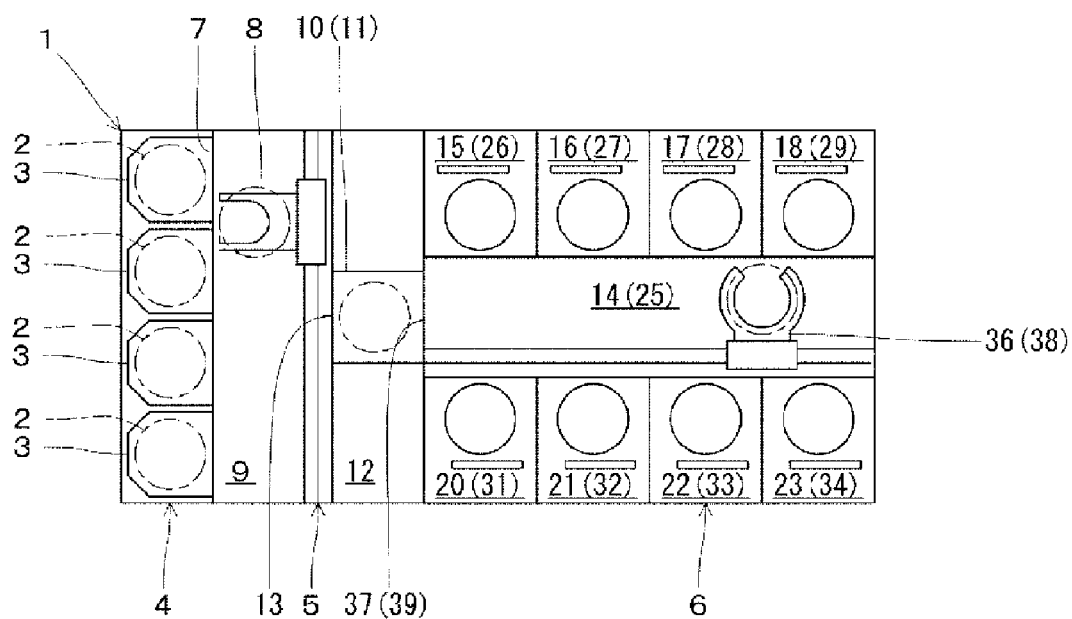
FIG. 1 is a plane view showing a liquid processing apparatus.

As depicted in FIG. 1, a liquid processing apparatus 1 may include a substrate loading/unloading table 4 provided at a front end thereof; a substrate transferring unit 5 at the rear of the substrate loading/unloading table 4; and a substrate processing unit 6 at the rear of the substrate transferring unit 5. The substrate loading/unloading table 4 may be configured to load and unload a plurality of (e.g., about 25) substrates 2 (here, semiconductor wafers) into and from each of carriers 3 in batch. The substrate transferring unit 5 may transfer substrates 2 accommodated in each carrier 3 one by one. The substrate processing unit 6 performs various processes such as resist removal or cleaning of the substrates 2.

The substrate loading/unloading table 4 may be configured to mount thereon four carriers 3 that are in firm contact with a front wall 7 of the substrate transferring unit 5 at a certain distance in left and right directions.

The substrate transferring unit 5 may include, at a front side, a transfer chamber 9 accommodating a transfer device 8; and, at a rear side, a substrate transit chamber 12 accommodating two substrate transit tables 10 and 11 vertically arranged therein.

In the substrate transferring unit 5, the transfer chamber 9 and the substrate transit chamber 12 are connected and communicate with each other through a transit port 13.

The substrate transferring unit 5 transfers the substrates 2 one by one by using the transfer device 8 between one of the carriers 3 on the substrate loading/unloading table 4 and one of the upper and lower substrate transit tables 10 and 11.

The substrate processing unit 6 may include a first substrate transfer chamber 14 elongated in an upper central region thereof along a forward/backward direction. Further, a first to a fourth substrate processing chamber 15 to 18 may be arranged on the left of the first substrate transfer chamber 14 along the forward/backward direction, and a fifth to an eighth substrate processing chamber 20 to 23 may be arranged on the right of the first substrate transfer chamber 14 along the forward/backward direction.

Furthermore, the substrate processing unit 6 may further include a second substrate transfer chamber 25 that is elongated in a lower central region thereof along the forward/backward direction, like the first substrate transfer chamber 14. A ninth to a twelfth substrate processing chambers 26 to 29 are arranged on the left of the second substrate transfer chamber 25 along the forward/backward direction, and a thirteenth to a sixteenth substrate processing chambers 31 to 34 are arranged on the right of the second substrate transfer chamber 25 along the forward/backward direction.

Here, the first substrate transfer chamber 14 may include a first substrate transfer device 36 configured to be movable in the forward/backward direction, and the first substrate transfer chamber 14 may communicate with the upper substrate transit table 10 of the substrate transit chamber 12 via a first substrate loading/unloading port 37. Further, the second substrate transfer chamber 25 may include a second substrate transfer device 38 configured to be movable in the forward/backward direction, and the second substrate transfer chamber 25 may communicate with the lower substrate transit table 11 of the substrate transit chamber 12 via a second substrate loading/unloading port 39.

As discussed above, the substrate processing unit 6 may have a vertical two-level configuration. In a first level, the first to fourth substrate processing chambers 15 to 18 and the fifth to eighth substrate processing chambers 20 to 23 are arranged along the forward/backward direction, and the first transfer chamber 14 elongated in the forward/backward direction is provided at the lateral of the first to fourth substrate processing chambers 15 to 18 and the fifth to eighth substrate processing chambers 20 to 23 arranged along the forward/backward direction. In a second level, the ninth to twelfth substrate processing chambers 26 to 29 and the thirteenth to sixteenth substrate processing chambers 31 to 34 are arranged along the forward/backward direction and the second substrate transfer chamber 25 is provided at the lateral of the ninth to twelfth substrate processing chambers 26 to 29 and the thirteenth to sixteenth substrate processing chambers 31 to 34 arranged along the forward/backward direction.

Further, in the substrate processing unit 6, substrates 2 horizontally held on the first or the second substrate transfer device 36 or 38 are transferred one by one between the substrate transit chamber 12 of the substrate transferring unit 5 and each of the substrate processing chambers 15 to 18 and 20 to 23 or 26 to 29 and 31 to 34. The substrates 2 are then processed in each of the substrate processing chambers 15 to 18, 20 to 23, 26 to 29 and 31 to 34 one by one.

The substrate processing chambers 15 to 18, 20 to 23, 26 to 29 and 31 to 34 may have the same configurations, and, below, a configuration of the first substrate processing chamber 15 will be explained.

Figure 2:
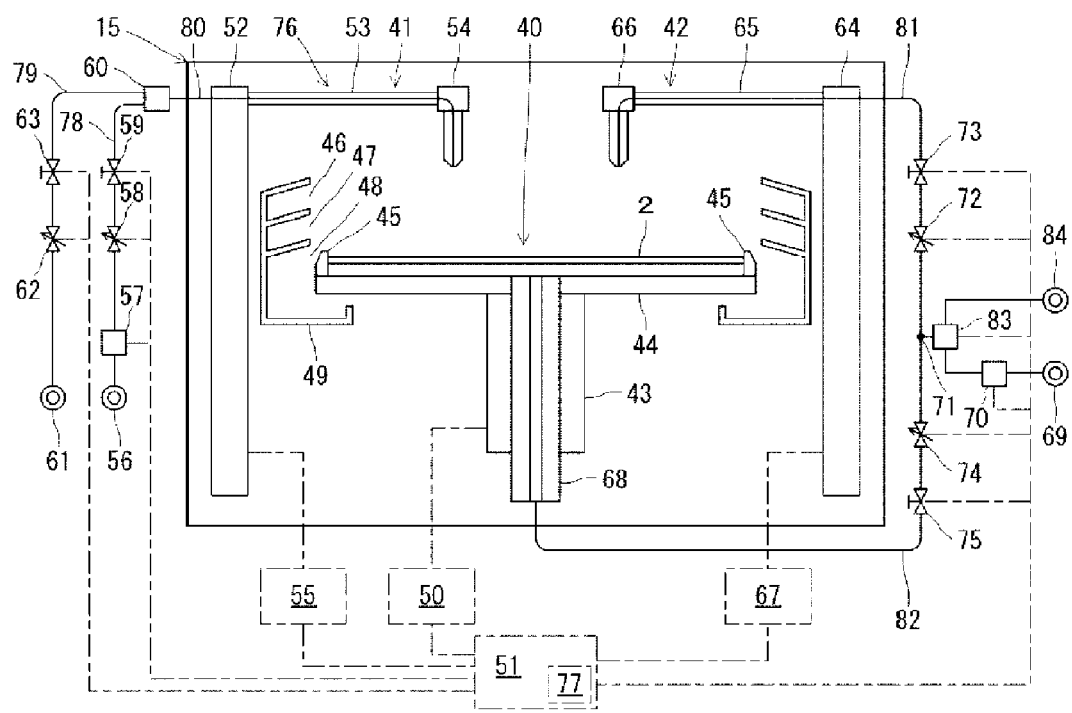
FIG. 2 is a schematic diagram illustrating a substrate processing chamber.

As illustrated in FIG. 2, the substrate processing chamber 15 accommodates therein a substrate holding unit 40 configured to hold a substrate 2, a processing solution supply unit 41 configured to supply a processing solution to the substrate 2 so as to perform a liquid process on the substrate 2 and a rinse solution supply unit 42 configured to supply a rinse solution to the substrate so as to perform a rinse process on the substrate 2.

The substrate holding unit 40 may include a vertically elongated rotation shaft 43 having a hollow cylinder shape and a circular plate-shaped turntable 44 placed on an upper end of the rotation shaft 43, and wafer chucks 45 are arranged on the peripheral area of a top surface of the turntable 44 at a certain distance along a circumferential direction. Further, a cup 49 having collection ports 46, 47 and 48 for collecting the processing solution or the rinse solution after the completion of the liquid process or the rinse process is provided outside the turntable 44, and is connected with a non-illustrated liquid drain pipe. The collection ports 46, 47 and 48 are vertically arranged in three levels.

In this substrate holding unit 40, the rotation shaft 43 is connected with a rotating/elevating mechanism 50, and as the rotation shaft 43 is rotated and elevated up and down by the rotating/elevating mechanism 50, a substrate 2 horizontally held by the wafer chucks 45 is also rotated and elevated up and down. Here, the rotating/elevating mechanism 50 is connected with a controller 51 and an operation of the rotating/elevating mechanism 50 is controlled by the controller 51.

The processing solution supply unit 41 may include a vertically elongated supporting shaft 52, an arm 53 horizontally mounted on an upper end of the supporting shaft 52 and a processing solution supply nozzle 54 provided at a leading end of the arm 53 while a discharge opening of the processing solution supply nozzle 54 faces downward.

In this processing solution supply unit 41, the supporting shaft 52 is connected with a rotating mechanism 55, and as the supporting shaft 52 is rotated by the rotating mechanism 55, the processing solution supply nozzle 54 is moved above the substrate 2 from a retreated position outside a peripheral area of the substrate 2 to a supply position above a central area of the substrate 2. Here, the rotating mechanism 55 is connected with the controller 51 and an operation of the rotating mechanism 55 is controlled by the controller 51.

Further, the processing solution supply unit 41 uses SPM (Sulfuric acid/hydrogen Peroxide Mixture) as a processing solution. The SPM is prepared by mixing sulfuric acid (first liquid chemical) and hydrogen peroxide (second liquid chemical) and allowing them to make a chemical reaction which generates reaction heat. A sulfuric acid supply source 56 for supplying sulfuric acid is connected with a mixing unit 60 via a first liquid chemical supply pipe 78. Further, a heater 57, a flow rate control valve 58 and a first opening/closing valve 59 are provided on the first liquid chemical supply pipe 78 in sequence. Meanwhile, a hydrogen peroxide supply source 61 for supplying hydrogen peroxide is also connected with the mixing unit 60 via a second liquid chemical supply pipe 79. Further, a flow rate control valve 62 and a second opening/closing valve 63 are provided on the second liquid chemical supply pipe 79 in sequence. The mixing unit 60 is connected with the processing solution supply nozzle 54 via a processing solution supply pipe 80. Here, the heater 57, the flow rate control valves 58 and 62 and the first and second opening/closing valves 59 and 63 are connected with and controlled by the controller 51.

The rinse solution supply unit 42 may include a vertically elongated supporting shaft 64, an arm 65 horizontally mounted on an upper end of the supporting shaft 64 and a rinse solution supply nozzle 66 provided at a leading end of the arm 65 so as to supply the rinse solution toward a front surface (top surface) of the substrate 2 while a discharge opening of the rinse solution supply nozzle 66 faces downward.

In this rinse solution supply unit 42, the supporting shaft 64 is connected with a rotating mechanism 67, and as the supporting shaft 64 is rotated by the rotating mechanism 67, the rinse solution supply nozzle 66 is moved above the substrate 2 from a retreated position outside a peripheral area of the substrate 2 to a supply position above a central area of the substrate 2. Here, the rotating mechanism 67 is connected with the controller 51 and an operation of the rotating mechanism 67 is controlled by the controller 51.

In addition, the rinse solution supply unit 42 further includes a rinse solution supply nozzle 68 for supplying the rinse solution toward a rear surface (bottom surface) of the substrate 2. The rinse solution supply nozzle 68 is installed within a hollow portion of the rotation shaft 43 of the substrate holding unit 40 while a discharge opening of the rinse solution supply nozzle 68 faces upward.

Further, the rinse solution supply unit 53 uses pure water as the rinse solution. A heater 70 is connected to a pure water supply source 69 for supplying pure water, and a pipe 71 branched into two is connected with the heater 70 via a flow path switching valve 83. One branch of the pipe 71 is connected with the rinse solution supply nozzle 66 via a rinse solution supply pipe 81, and a flow rate control valve 72 and a rinse solution opening/closing valve 73 are provided on the rinse solution supply pipe 81 in sequence. Meanwhile, the other branch of the pipe 71 is connected with the rinse solution supply nozzle 68 via a rinse solution supply pipe 82, and a flow rate control valve 74 and a rinse solution opening/closing valve 75 are provided on the rinse solution supply pipe 82 in sequence. Further, the flow path switching valve 83 is connected with a pure water supply source 84 for supplying a pure water of a normal temperature. Here, the heater 70, the flow rate control valves 72 and 74, the rinse solution opening/closing vales 73 and 75 and the flow path switching valve 83 are connected with and controlled by the controller 51.

In the liquid processing apparatus 1 in accordance with the embodiment of the present disclosure, the substrate processing chamber 15 further accommodates therein an intermediate processing unit 76 capable of performing an intermediate process for adjusting a temperature of the front surface of the substrate to be higher than the temperature of the rinse solution and lower than the temperature of the processing solution by supplying an intermediate processing solution having a temperature higher than the temperature of the rinse solution and lower than the temperature of the processing solution.

Although the intermediate processing unit 76 may be provided as a separate component from the processing solution supply unit 41 or the rinse solution supply unit 42, both the processing solution supply unit 41 and the rinse solution supply unit 42 serve as the intermediate processing unit 76 in the aforementioned liquid processing apparatus 1.

In the liquid processing apparatus 1 as configured above, the substrate 2 is processed in each of the substrate processing chambers 15 to 18, 20 to 23, 26 to 29 and 31 to 34 according to the liquid processing program stored in a storage medium 77 readable by the controller 51 (computer). Further, the storage medium 77 may include a medium capable of storing various programs such as the liquid processing program. Furthermore, the storage medium 77 may include a semiconductor memory such as ROM or RAM as well as a disc such as a hard disc or a CD-ROM.

Figure 11:
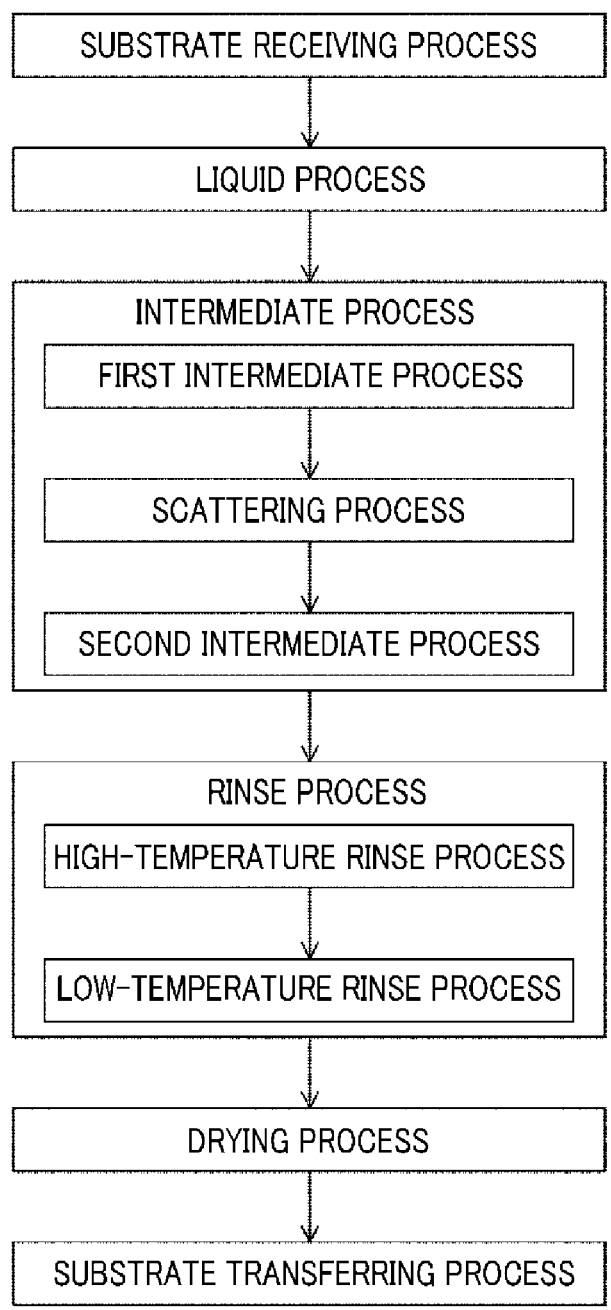
FIG. 11 shows a process sequence.

In the liquid processing apparatus, the substrate 2 is processed according to a process sequence shown in FIG. 11 by the liquid processing program. For the simplicity of the explanation, it will be explained that the substrate 2 is processed in the substrate processing chamber 15, but the same processes as performed in the substrate processing chamber 15 may be performed in other substrate processing chambers 16 to 18, 20 to 23, 26 to 29 and 31 to 34.

First, as illustrated in FIG. 11, a substrate receiving process for receiving the substrate 2 from the substrate transfer device 36 is performed according to the liquid processing program.

Figure 3:
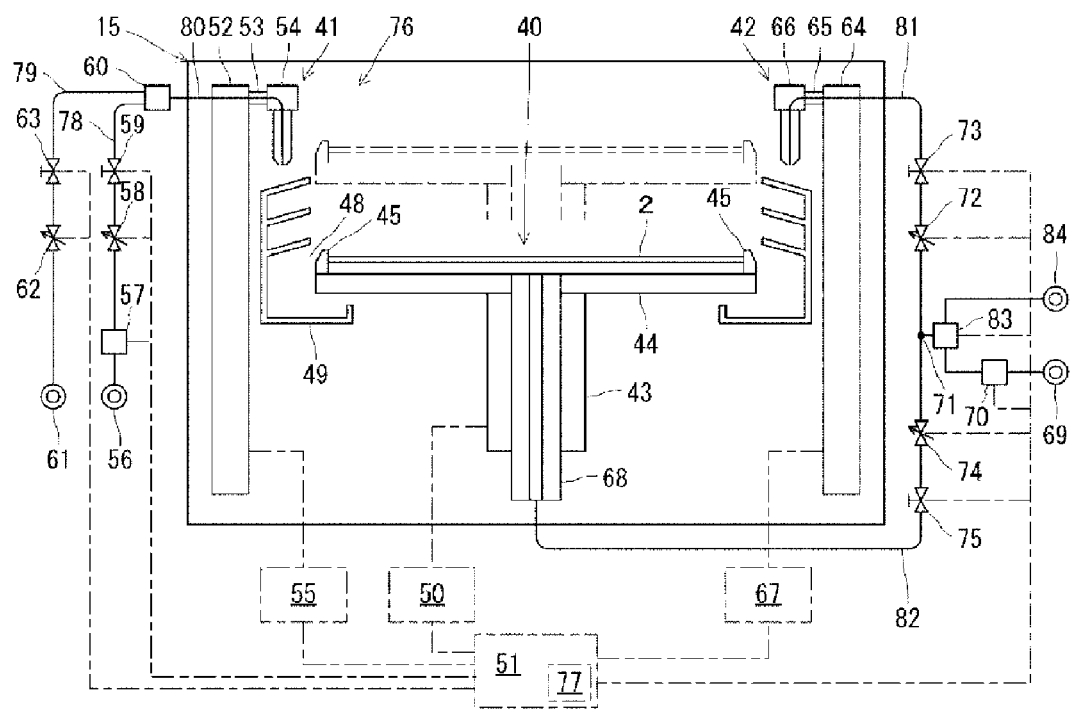
FIG. 3 is a diagram for describing an operation (substrate receiving process) in the substrate processing chamber.

In the substrate receiving process, under the control of the controller 51, as illustrated in FIG. 3, the turntable 44 of the substrate holding unit 40 is raised to a preset position by the rotating/elevating mechanism 50; a single sheet of substrate 2 transferred into the substrate processing chamber 15 from the substrate transfer device 36 is received and horizontally held by the wafer chucks 45; and, then, the turntable 44 of the substrate holding unit 40 is lowered by the rotating/elevating mechanism 50 to a position where an edge of the substrate 2 faces the lowermost collection port 48 of the cup 49. At this time, according to the liquid processing program, the processing solution supply nozzle 54 of the processing solution supply unit 41 and the rinse solution supply nozzle 66 of the rinse solution supply unit 42 are retreated to retreated positions outside a peripheral area of the turntable 44.

Subsequently, as illustrated in FIG. 11, a liquid process for processing the front surface of the substrate 2 by using a processing solution is performed according to the liquid processing program.

Figure 4:
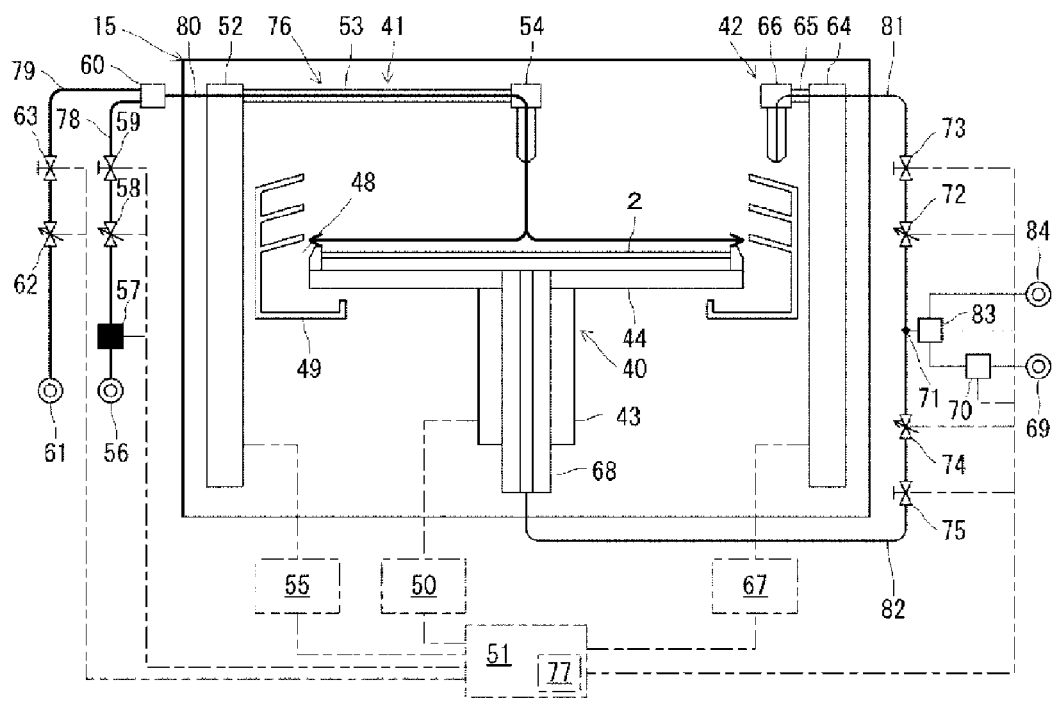
FIG. 4 is a diagram for describing an operation (liquid process) in the substrate processing chamber.

In the liquid process, under the control of the controller 51, as illustrated in FIG. 4, the processing solution supply nozzle 54 is moved to the supply position above the central area of the substrate 2 by rotating the supporting shaft 52 of the processing solution supply unit 41 by the rotating mechanism 55; the substrate 2 is rotated by rotating the turntable 44 of the substrate holding unit 40 by the rotating/elevating mechanism 50; the heater 57 of the processing solution supply unit 41 is driven; the first and second opening/closing valves 59 and 63 are opened and the sulfuric acid (first liquid chemical) and the hydrogen peroxide (second liquid chemical) of which flow rates have been controlled by the flow rate control valves 58 and 62 are mixed in the mixing unit 60 to thereby generate the mixed solution (SPM) as the processing solution; and the SPM is discharged from the processing solution supply nozzle 54 toward the central area of the front surface of the substrate 2. At this time, according to the liquid processing program, the sulfuric acid is heated by the heater 57 to about 130° C., and the heated sulfuric acid is then made to chemically act on the hydrogen peroxide having a room temperature in the mixing unit 60, so that the reaction heat is generated and the temperature of the processing solution (SPM) reaches about 170° C.

By this liquid process, a resist on the front surface of the substrate 2 is removed by the processing solution, and the resist removed by the processing solution is then mainly collected into the lowermost collection port 48 of the cup 49 by a centrifugal force of the rotating substrate 2.

Thereafter, according to the liquid processing program, as shown in FIG. 11, an intermediate process includes a first intermediate process, a scattering process and a second intermediate process between the liquid process and a rinse process to be described later. First, the first intermediate process for supplying, to the front surface of the substrate 2, a first intermediate processing solution having a temperature higher than the temperature of the rinse solution and lower than the temperature of the processing solution is performed according to the liquid processing program.

Figure 5:
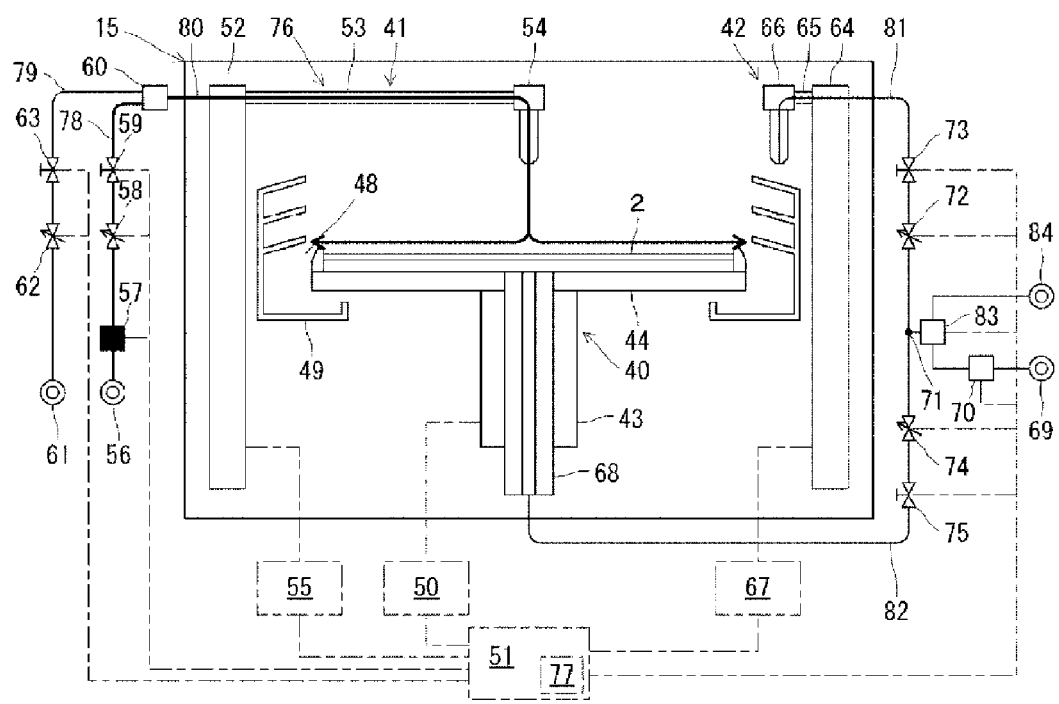
FIG. 5 is a diagram for describing an operation (first intermediate process) in the substrate processing chamber.

In the first intermediate process, under the control of the controller 51, as shown in FIG. 5, in a state that the first opening/closing valve 59 of the processing solution supply unit 41 is opened and the second opening/closing valve 63 of the processing solution supply unit 41 is closed, only the sulfuric acid heated to about 130° C. by the heater 57 is discharged from the processing solution supply nozzle 54 toward the central area of the front surface of the substrate 2. At this time, since the hydrogen peroxide is not supplied, the chemical reaction between the hydrogen peroxide and the sulfuric acid does not take place, so that the first intermediate processing solution (sulfuric acid) having a temperature (about 130° C.) equal to or higher than a temperature (about 80° C.) of the second intermediate processing solution (pure water) to be described later (and equal to or higher than the temperature (about 80° C.) of the rinse solution (pure water)) and lower than the temperature (about 170° C.) of the processing solution (SPM) can be supplied to the front surface of the substrate 2.

During this first intermediate process, the first intermediate processing solution is mainly collected into the lowermost collection port 48 of the cup 49 by a centrifugal force of the rotating substrate 2, like the processing solution of which composition is partially the same as that of the first intermediate processing solution.

By performing this first intermediate process, the temperature of the substrate 2 is not rapidly decreased from the temperature in the liquid process to the temperature in the rinse process to be described later, but the temperature of the substrate 2 may be gradually decreased to the intermediate temperature therebetween. As a result, a thermal deformation due to a rapid temperature variation of the substrate 2 can be suppressed, and, thus, the substrate 2 can be firmly held by the wafer chucks 45 of the substrate holding unit 40. Furthermore, since dispersion of the processing solution due to the deformation of the substrate 2 can be prevented, contamination or damage of the inside of the substrate processing chamber 15 can be avoided.

Especially, in the above-described liquid processing apparatus 1, the processing solution supply unit 41 supplies, as the processing solution, the mixed solution (SPM) of the two kinds of liquid chemicals such as the hydrogen peroxide and the sulfuric acid that make a chemical reaction generating reaction heat, and the intermediate processing unit 76 stops the supply of one liquid chemical (hydrogen peroxide) during the intermediate process. Accordingly, the structure of the apparatus can be simplified, and the first intermediate processing solution having a temperature lower than that of the processing solution can be supplied to the substrate 2 promptly.

Moreover, according to the liquid processing program, although the first intermediate processing solution (sulfuric acid) is heated to about 130° C. by the heater 57, the present disclosure may not be limited thereto. By way of example, a setting temperature of the heater 57 may be gradually reduced, or the operation of the heater 57 may be stopped, and the first intermediate processing solution (sulfuric acid) of which temperature decreases gradually may be supplied to the front surface of the substrate 2.

Subsequently, as shown in FIG. 11, a scattering process for scattering the first intermediate processing solution from the front surface of the substrate 2 is performed by rotating the substrate 2 according to the liquid processing program.

Figure 6:
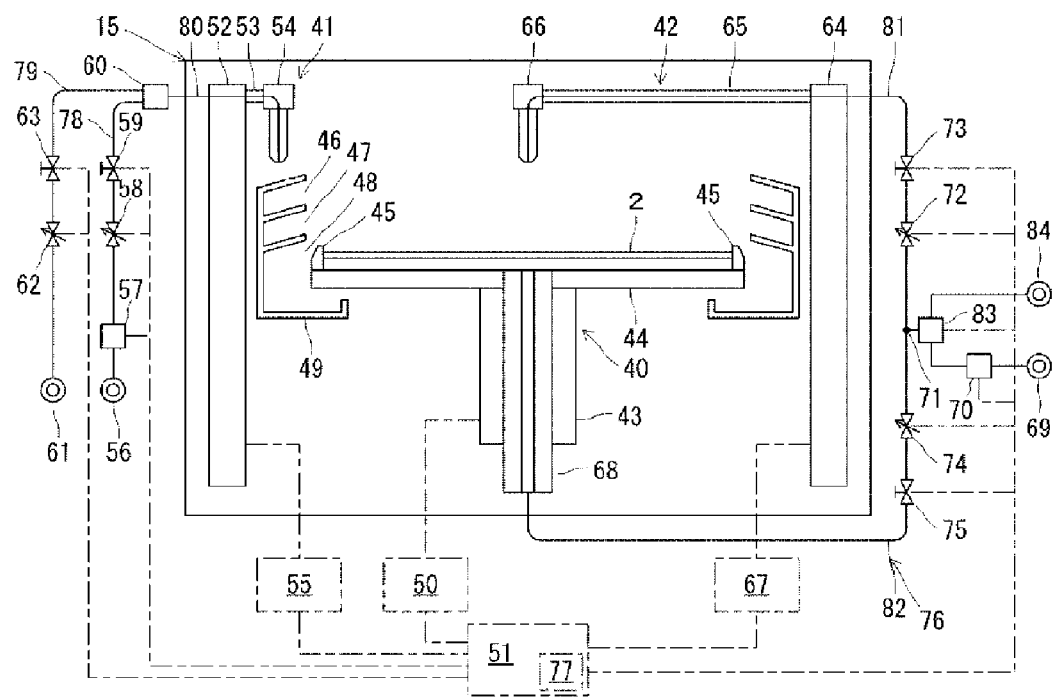
FIG. 6 is a diagram for describing an operation (scattering process) in the substrate processing chamber.

In the scattering process, under the control of the controller 51, as illustrated in FIG. 6, the processing solution supply nozzle 54 is retreated to the retreated position outside the peripheral area of the turntable 44 by rotating the supporting shaft 52 by the rotating mechanism 55 of the processing solution supply unit 41, and the rinse solution supply nozzle 66 is moved to a supply position above a central area of the substrate 2 by rotating the supporting shaft 64 by the rotating mechanism 67 of the rinse solution supply unit 42. Concurrently, under the control of the controller 51, the substrate 2 is rotated for a preset time by rotating the turntable 44 of the substrate holding unit 40 by the rotating/elevating mechanism 50 at a speed higher than those in the liquid process and the first intermediate process.

By this scattering process, the first intermediate processing solution remaining on the front surface of the substrate 2 may be mostly collected into the lowermost collection port 48 of the cup 49 by the centrifugal force of the rotating substrate 2, and, thus, the first intermediate processing solution is removed from the front surface of the substrate 2.

By performing this scattering process, the first intermediate processing solution that may make a chemical reaction with the rinse solution is removed from the front surface of the substrate 2, and the temperature of the substrate 2 can be gradually decreased during a time for replacing the processing solution supply nozzle 54 and the rinse solution supply nozzle 66. Furthermore, since the temperature of the substrate 2 is gradually decreased in this scattering process, this scattering process may be used as an intermediate process in which the front surface of the substrate 2 is adjusted to have a temperature higher than the temperature of the rinse solution and lower than the temperature of the processing solution between the liquid process and the rinse process.

Subsequently, as depicted in FIG. 11, a second intermediate process for supplying, to the rear surface of the substrate 2, a second intermediate processing solution having a temperature higher than the temperature of the rinse solution and lower than the temperature of the first intermediate processing solution is performed according to the liquid processing program.

Figure 7:
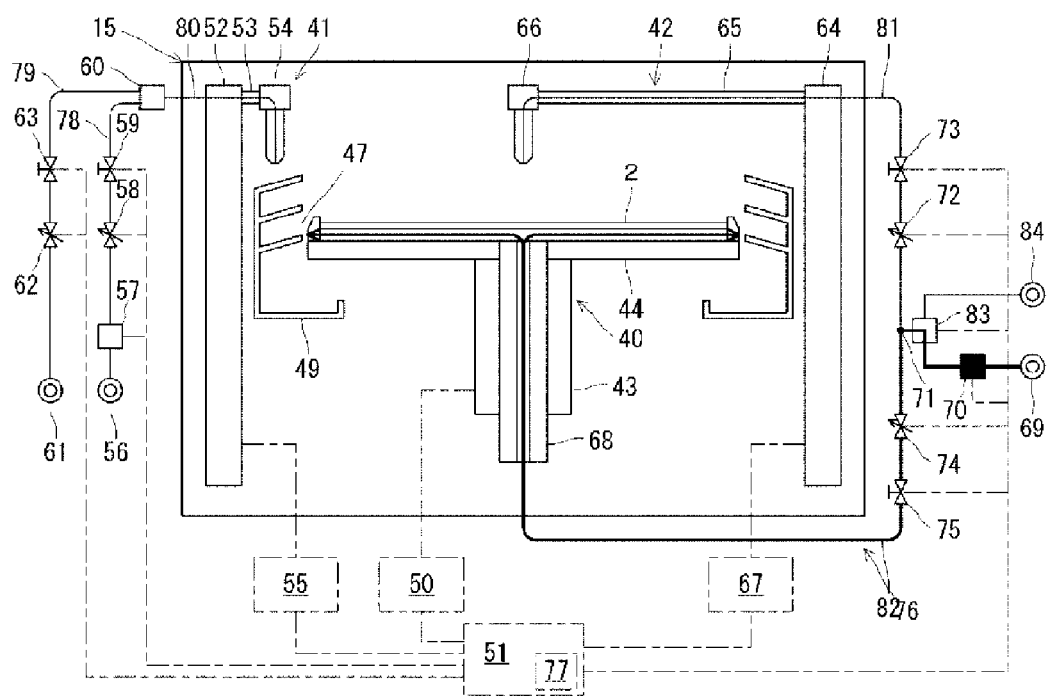
FIG. 7 is a diagram for describing an operation (second intermediate process) in the substrate processing chamber.

In the second intermediate process, under the control of the controller 51, as depicted n FIG. 7, the turntable 44 of the substrate holding unit 40 is raised by the rotating/elevating mechanism 50 to a position where the outer peripheral end of the substrate 2 faces an intermediate collection port 47 of the cup 49, and the substrate 2 is rotated by rotating the turntable 44 at a higher speed than that in the scattering process. Further, under the control of controller 51, the heater 70 of the rinse solution supply unit 42 is driven in a state that the flow path switching valve 83 is switched to the pure water supply source 69; and in a state that only the rinse solution opening/closing valve 75 is opened, the second intermediate processing solution (pure water) of which a flow rate has been controlled by the flow rate control valve 74 is discharged from the rinse solution supply nozzle 68 toward a central area of the rear surface of the substrate 2 for a preset time. At this time, the controller 51 controls the heater 70 to adjust the temperature of the second intermediate processing solution (pure water) to about 80° C. Accordingly, the second intermediate processing solution (pure water) having the temperature (about 80° C.) equal to or higher than the temperature (about 80° C.) of the rinse solution (pure water) to be described later and lower than the temperature (about 130° C.) of the first intermediate processing solution (sulfuric acid) is supplied to the rear surface of the substrate 2.

By this second intermediate process, the second intermediate processing solution is mostly collected into the intermediate collection port 47 of the cup 49 by the centrifugal force of the rotating substrate 2.

By performing this second intermediate process, the temperature of the rear surface of the substrate 2 can be decreased to a temperature close to the temperature in the rinse process in a short time. Especially, since the second intermediate processing solution is supplied to the rear surface of the substrate 2, even if the first intermediate processing solution remains on the front surface of the substrate 2, a rapid chemical reaction between the first intermediate processing solution and the rinse solution can be suppressed. Accordingly, dispersion of reaction products generated by the chemical reaction can be prevented, so that contamination or damage of the inside of the substrate processing chamber 15 can be avoided.

Further, under the control of the controller 51, although the second intermediate processing solution (pure water) is heated to about 80° C. by the heater 70, the present disclosure may not limited thereto. By way of example, a setting temperature of the heater 70 may be gradually reduced, or the operation of the heater 70 may be stopped, and the second intermediate processing solution (pure water) of which temperature decreases gradually may be supplied to the rear surface of the substrate 2.

Subsequently, as illustrated in FIG. 11, a rinse process for processing the substrate 2 with the rinse solution is performed according to the liquid processing program. The rinse process includes a high-temperature rinse process and a low-temperature rinse process performed at a temperature (normal temperature) lower than that in the high-temperature rinse process. The high-temperature rinse process for processing both the front and the rear surface of the substrate 2 by using a high-temperature rinse solution is performed according to the liquid processing program.

Figure 8:
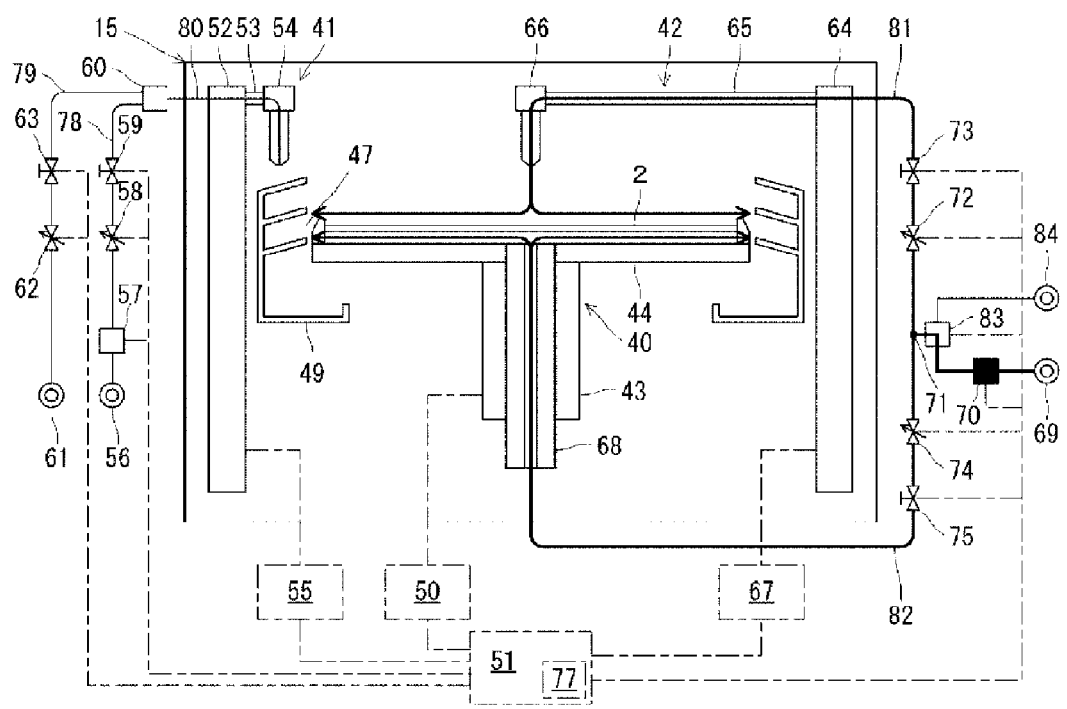
FIG. 8 is a diagram for describing an operation (high-temperature rinse process) in the substrate processing chamber.

In the high-temperature rinse process, under the control of the controller 51, as illustrated in FIG. 8, the substrate 2 is rotated by rotating the turntable 44 of the substrate holding unit 40 by the rotating/elevating mechanism 50 at a speed lower than a speed in the second intermediate process (equal to a speed in the liquid process). Further, under the control of the controller 51, in a state that the flow path switching valves 83 is switched to the pure water supply source 69 and the rinse solution opening/closing valve 73 of the rinse solution supply unit 42 is also opened, the rinse solution (pure water) of which a flow rate is controlled by the flow rate control valves 72 and 74 is discharged toward the central areas of both the front surface and the rear surface of the substrate 2 from the rinse solution supply nozzle 66 and 68 for a preset time. At this time, the controller 51 controls the heater 70 to adjust the temperature of the rinse solution (pure water) to about 80° C. that is the same as a temperature of the second intermediate processing solution. Accordingly, the rinse solution (pure water) of about 80° C. is supplied to both the front surface and the rear surface of the substrate 2.

During the high-temperature rinse process, the rinse solution is mainly collected into the intermediate collection port 47 of the cup 49 by the centrifugal force of the rotating substrate 2, like the second intermediate processing solution of which a composition is the same as the composition of the second intermediate processing solution.

By performing the high-temperature rinse process, a temperature of the front surface of the substrate 2 can be decreased. Therefore, in the following normal-temperature rinse process, the substrate can be prevented from being deformed due to a rapid temperature variation of the substrate 2.

Subsequently, as illustrated in FIG. 11, the low-temperature rinse process for processing both the front surface and the rear surface of the substrate 2 by using a rinse solution at a normal temperature (a temperature lower than that of the rinse solution in the high-temperature rinse process) is performed according to the liquid processing program.

Figure 9:
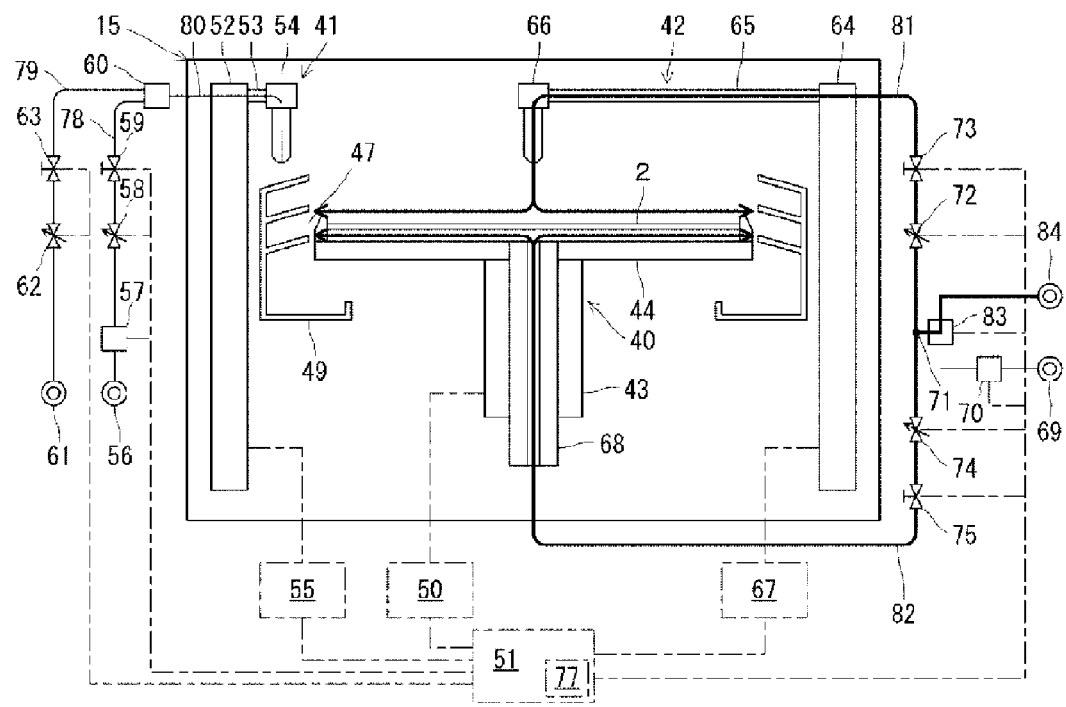
FIG. 9 is a diagram for describing an operation (low-temperature rinse process) in the substrate processing chamber.

In the normal-temperature rinse process, under the control of the controller 51, as illustrated in FIG. 9, the substrate 2 is rotated by rotating the turntable 44 of the substrate holding unit 40 by the rotating/elevating mechanism 50 at a speed higher than the speed in the high-temperature rinse process (equal to the speed in the second intermediate process). Further, in a state that the flow path switching valves 83 is switched to the pure water supply source 84, the rinse solution (pure water) of which a flow rate has been controlled by the flow rate control valves 72 and 74 is discharged toward the central portions of both the front surface and the rear surface of the substrate 2 from the rinse supply nozzle 66 and the rinse solution supply nozzle 68. Accordingly, the rinse solution (pure water) of the normal temperature lower than 80° C. is supplied to both the front surface and the rear surface of the substrate 2.

During this normal-temperature rinse process, the rinse solution is mostly collected into the intermediate collection port 47 of the cup 49 by the centrifugal force of the rotating substrate 2, like the second intermediate processing solution of which a composition is the same as that of the rinse solution.

Subsequently, as depicted in FIG. 11, a drying process for drying the substrate 2 is performed according to this liquid processing program.

Figure 10:
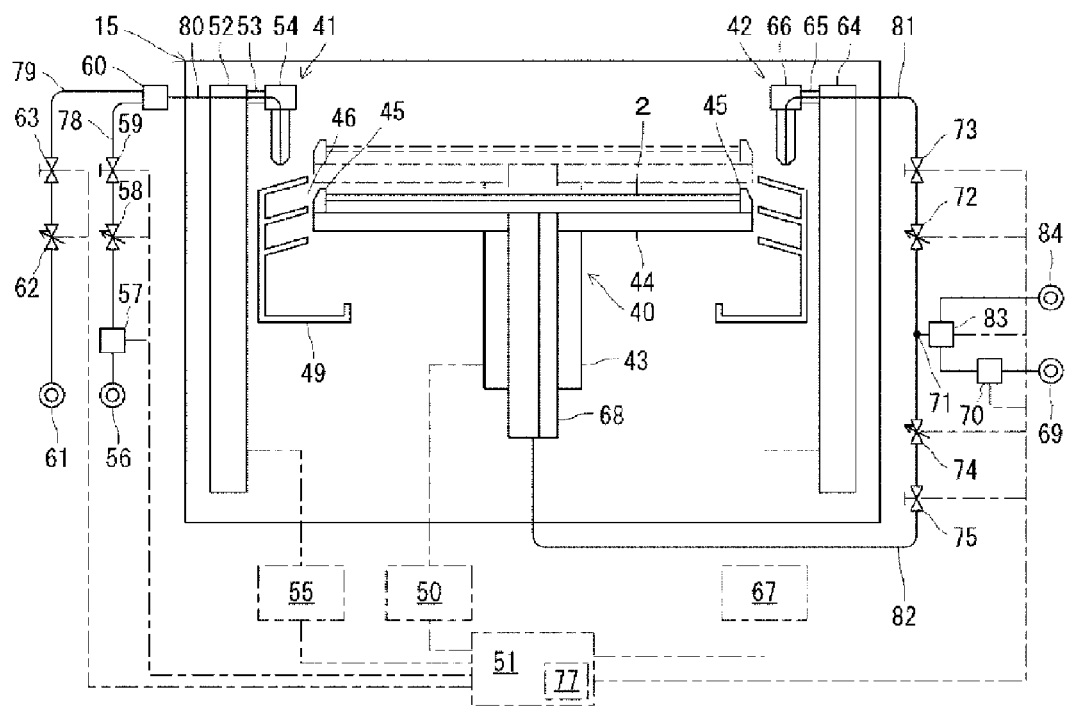
FIG. 10 is a diagram for describing an operation (drying process and substrate transferring process) in the substrate processing chamber.

In the drying process, under the control of the controller 51, as depicted in FIG. 10, the turntable 44 of the substrate holding unit 50 is raised by the rotating/elevating mechanism 50 to a position where the outer peripheral end of the substrate 2 faces the topmost collection port 46 of the cup 49, and the substrate 2 is rotated for a preset time by rotating the turntable 44 at a speed equal to the speed in the low-temperature rinse process.

By this drying process, the rinse solution remaining on the surface of the substrate 2 is mostly collected into the topmost collection port 46 of the cup 49 by the centrifugal force of the rotating substrate 2.

Thereafter, as depicted in FIG. 11, a substrate transferring process for transferring the substrate 2 to the substrate transfer device 36 is performed according to the liquid processing program.

In this substrate transferring process, under the control of the controller 51, the turntable 44 of the substrate holding unit 40 is gradually decelerated and stopped by the rotating/elevating mechanism 50; the turntable 44 is raised to a predetermined position; and the substrate 2 is transferred to the substrate transfer device 36. At this time, under the control of the controller 51, the rinse solution supply nozzle 66 of the rinse solution supply unit 42 is retreated to a retreated position outside the outer peripheral area of the turntable 44, like the processing solution supply nozzle 54 of the processing solution supply unit 41.

As discussed above, in the aforementioned liquid processing apparatus 1, by performing the intermediate process for adjusting the temperature of the surface of the substrate to be higher than the rinse processing solution and lower than the temperature of the processing solution between the liquid process and the rinse process of the substrate 2, a temperature variation of the substrate 2 can be reduced, and, thus, a thermal deformation of the substrate 2 can be suppressed. As a result, the substrate 2 can be firmly held by the substrate holding unit 40, and since dispersion of the processing solution following the deformation of the substrate 2 can be prevented, contamination or damage of the inside of the substrate processing chamber 15 can be avoided.

Moreover, in the liquid processing apparatus 1, since the temperature of the substrate 2 immediately after the beginning of the rinse process can be reduced as compared to a conventional case, a rapid chemical reaction between the processing solution and the rinse solution can be prevented even in case the processing solution and the rinse solution chemically act on each other depending on the kind of the processing solution or the rinse solution. Accordingly, dispersion of reaction products generated by the chemical reaction can be suppressed, and, thus, contamination or damage of the inside of the substrate processing chamber 15 can be avoided.

In addition, in the above-described liquid processing apparatus 1, although the first intermediate process, the scattering process and the second intermediate process are performed as an intermediate process between the liquid process and the rinse process of the substrate 2, only a part of these processes may be performed as long as a temperature of the front surface of the substrate 2 can be gradually decreased between the liquid process and the rinse process of the substrate 2. That is, only one of the first intermediate process, the scattering process and the second intermediate process may be performed depending on a temperature difference during the liquid process and the rinse process. Alternatively, combination of the first intermediate process and the second intermediate process may be performed.

What is claimed is:

1. A liquid processing method for performing a liquid process on a front surface of a substrate by using a processing solution and then performing a rinse process on the front surface of the substrate by using a first rinse solution and a second rinse solution having a temperature lower than a temperature of the processing solution, the method comprising:
performing an intermediate process between the liquid process and the rinse process, for adjusting a temperature of the front surface of the substrate to a temperature higher than the temperature of the second rinse solution and lower than the temperature of the processing solution,
wherein, in the intermediate process, an intermediate processing solution having a temperature higher than the temperature of the second rinse solution and lower than the temperature of the processing solution is supplied only to a rear surface of the substrate, and
in the rinse process, the first rinse solution having a temperature substantially equal to the temperature of the intermediate processing solution is supplied to the front surface of the substrate and, then, the second rinse solution having a temperature lower than the temperature of the intermediate processing solution is supplied to the front surface of the substrate.

2. The liquid processing method of claim 1, wherein, in the intermediate process, the substrate is rotated in a state that a supply of the processing solution and supplies of the first and second rinse solutions are stopped.

3. A liquid processing method for performing a liquid process on a front surface of a substrate by using a processing solution and then performing a rinse process on the front surface of the substrate by using a first rinse solution and a second rinse solution having a temperature lower than a temperature of the processing solution, the method comprising:
performing an intermediate process between the liquid process and the rinse process, for adjusting a temperature of the front surface of the substrate to a temperature higher than the temperature of the second rinse solution and lower than the temperature of the processing solution,
wherein, in the intermediate process, between the liquid process and the rinse process performed on the front surface of the substrate, a first intermediate processing solution having a temperature higher than the temperature of the second rinse solution and lower than the temperature of the processing solution is supplied to the front surface of the substrate and, then, a second intermediate processing solution having a temperature higher than the temperature of the second rinse solution and lower than the temperature of the first intermediate processing solution is supplied to the rear surface of the substrate, and
in the rinse process, the first rinse solution having a temperature substantially equal to the temperature of the second intermediate processing solution is supplied to the front surface of the substrate and, then, the second rinse solution having a temperature lower than the temperature of the second intermediate processing solution is supplied to the front surface of the substrate.

4. The liquid processing method of claim 3, wherein the processing solution includes a mixed solution of fluoric acid and oxygenated water,
the first intermediate processing solution includes heated sulfuric acid,
the second intermediate processing solution includes pure water, and
the first and second rinse solutions include pure water.

* * * * *